HIGH REPETITION RATE TIME DELAY CIRCUIT

Filed Dec. 17, 1964

John J. Hickey,
INVENTOR.
BY.
Jerry A. Dinardo
AGENT.

United States Patent Office 3,214,612
Patented Oct. 26, 1965

3,214,612
HIGH REPETITION RATE TIME DELAY CIRCUIT
John J. Hickey, Hawthorne, Calif., assignor to TRW Inc., a corporation of Ohio
Filed Dec. 17, 1964, Ser. No. 419,029
5 Claims. (Cl. 307—88.5)

Figure 1:
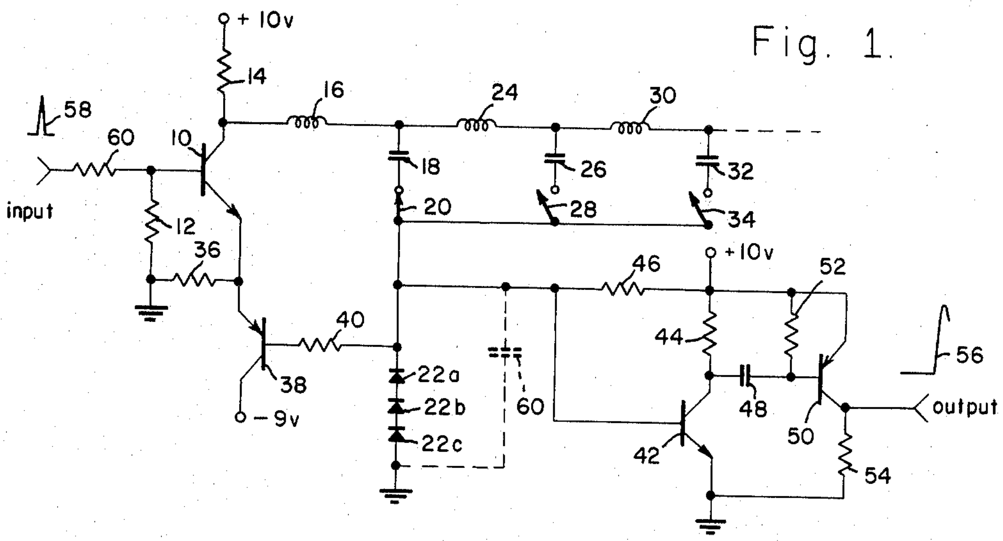

This invention relates generally to wave generating circuits, and particularly to improvements in electronic time delay generators capable of generating time delays at high repetition rates.

The need for high repetition rate delay generators has become more apparent since the advent of laser rangefinders, gated electro-optical receivers and general electro-optical stroboscopy. One present day type of delay generator utilizes a high-current conducting thyratron as a switch to discharge a capacitor in a series resonant circuit. The time duration of the first half cycle of oscillation is a measure of the time delay. This type of delay generator is disclosed in U.S. Patent 2,878,382 to Creveling. The repetition rate of the Creveling circuit is seriously limited because of the need for a high series charging resistance to cause the thyratron to deionize following the discharge of the capacitor.

Higher repetition rates may be realized by utilizing a regenerative transistor circuit in place of the thyratron, as disclosed in my copending application Serial No. 227,401 filed October 1, 1962. The latter type of delay generator employs a resistance-capacitance discharge circuit coupled to the regenerative transistor circuit to minimize the "on" time of the transistor switch and thereby increase the repetition rate. However, in order to compensate for any variations in characteristics between commercially supplied transistors, it is necessary to design the resistance-capacitance discharge circuit with a longer time constant than would be necessary in the absence of transistor characteristic variations. Furthermore, in order to provide a circuit capable of variable time delay without changing the parameters of the resistance capacitance discharge circuit, it is necessary to design the discharge circuit with a time constant long enough to accommodate the longest delay time desired. The repetition rate for the shorter time delays is thereby limited by the repetition rate of the longest time delay.

It is therefore an object of this invention to increase the repetition rate of a time delay circuit of the general character described above.

Another object of this invention is to provide a time delay generator with variable time delay and with greater repetition rates for short time delays than for long time delays.

The foregoing and other objects are realized according to the invention by coupling to a regenerative transistor switching circuit a portion of the oscillatory voltage that is produced across a diode means in the series resonant circuit. The portion of the voltage so coupled is used to control the switching circuit in such a manner as to permit the capacitor to recharge immediately following the generation of the delayed pulse. In this way, the inductance and capacitance of the series resonant circuit, which determine the delay time, also determine the time when the resonant circuit is turned off. It is thus assured that no matter what value of delay time is selected, the resonant circuit will be turned off immediately after the delay pulse is produced.

Figure 2:
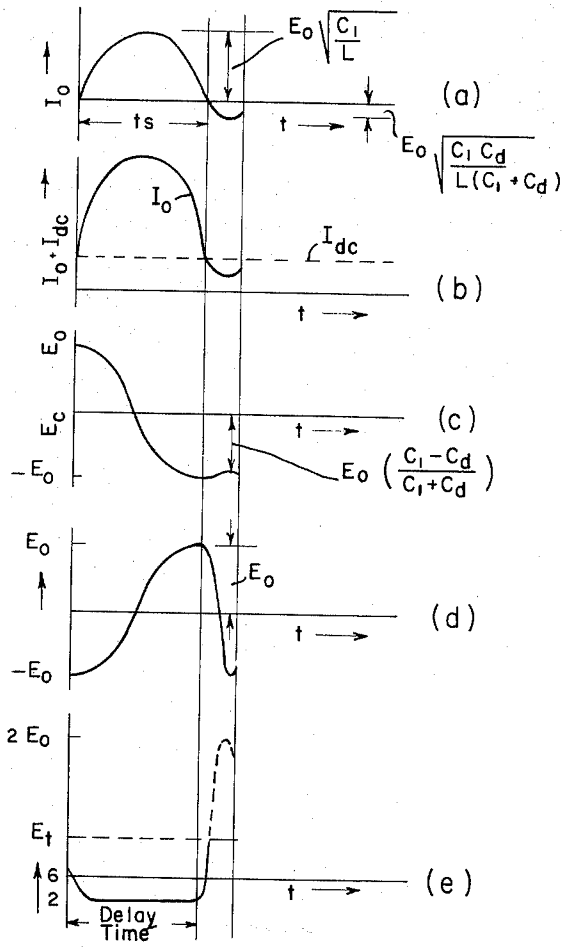

In the drawing:

FIG. 1 is a schematic diagram illustrating one form of delay circuit according to the invention; and FIG. 2 is a series of graphs of waveforms useful in explaining the operation of the delay circuit of FIG. 1.

Referring to FIG. 1, the delay circuit illustrated includes a switching device or first transistor 10. The first transistor 10 is illustrated as an NPN transistor having its base connected through a resistor 12 to ground. The collector is connected through a current limiting resistor 14 to a source of positive voltage, such as 10 volts.

The collector is connected in series with an inductor 16, a capacitor 18, a switch 20, shown in its closed position, and diode means, which are shown as three semiconductor diodes **22*a*, 22*b*, 22*c*. An additional inductor and capacitor, such as an inductor 24 and capacitor 26, may be connected in parallel with the capacitor 18 by closing a series switch 28. Similarly, an additional inductor 30 and capacitor 32 may be connected across the capacitor 26 by closing a series switch 34**.

The emitter of the first transistor 10 is connected through a resistor 36 to ground. The emitter is also connected to the emitter of a second transistor 38, shown as a PNP transistor. The collector of the second transistor 38 is connected to a source of negative voltage, such as —9 volts. The base is coupled through a resistor 40 to the cathode of the uppermost diode **22*a***.

The cathode of the uppermost diode **22*a* is connected to the base of a third transistor 42, shown as an NPN transistor. The emitter of the third transistor is grounded. The collector is connected through a resistor 44 to a source of positive voltage, such as 10 volts. The base is connected to the positive voltage source through a resistor 46**.

The collector of the third transistor 42 is coupled through a capacitor 48 to the base of a fourth transistor 50, shown as a PNP transistor. A resistor 52 is connected in shunt with the base and emitter. The collector, from which the output is taken, is connected through a resistor 54 to ground. A delay pulse 56 is produced across the load resistor 54 by coupling a trigger pulse 58 through a resistor 60 to the base of the first transistor 10.

The operation of the time delay circuit will now be described. In the absence of the trigger pulse 58, the transistors 10, 38, and 50 are off and transistor 42 is on. The capacitor 18 is charged to 10 volts, in the direction of conventional current flow, from the positive 10 volt source through the series charging circuit including the base emitter junction of the third transistor 42, the 10 volt source, resistor 14, and inductor 16. Charging current does not flow through the diodes **22*a*–22*c* because the latter presents a high impedance in the direction of charging current flow. The voltage drop across the base-emitter junction of the third transistor 42** appears across the series diodes as a positive initial back bias of say .6 volt.

A positive input current pulse 58 coupled through the resistor 60 to the base of the first transistor 10 causes the latter to conduct. The second transistor is then caused to conduct since its emitter is driven positive by the conduction of the first transistor through the resistor 36. The steady direct current $I_{dc}$ flowing through the transistors 10 and 38 through collector-emitter circuit of transistor 38 and through the emitter-collector circuit of transistor 10 when they reach full conduction is approximately equal to the voltage of the positive voltage source of 10 volts divided by the resistance of resistor 14.

When conduction is established through the transistors 10 and 38, a path is provided therethrough for the oscillatory discharge of the capacitor 18. Oscillatory current $I_o$ flows in the resonant circuit including the capacitor 18, inductor 16, transistors 10 and 38, and the diodes **22*a*–22*c*. When the diodes conduct, the initial back bias voltage is overcome and a small negative voltage is developed thereacross. While the impedance of the diodes is low, it is nevertheless sufficient to develop a voltage of about —2 volts. The negative voltage across the diodes 22*a*–22*c* is coupled through the resistor 40 to the base of transistor 38, which turns the latter on harder. Turning on transistor 38 harder causes transistor 10 to turn on harder, whereupon regeneration takes over and permits the circuit to stay on with the removal of the trigger pulse 58**.

The negative voltage across the diodes 22$a$–22$c$ is also coupled to the base of transistor 42, turning the latter off and causing capacitor 48 to discharge through resistors 44 and 52.

Reference is now made to the graphs of FIG. 2 which depict the current and voltage waveforms associated with the various circuit elements. Graph 2($a$) illustrates the oscillatory current $I_o$ flowing in the oscillatory circuit. Graph 2($b$) illustrates the composite direct current $I_{dc}$ and oscillatory current $I_o$ flowing through the transistors 10 and 38; Graph 2($c$) illustrates the voltage across the capacitor 18. Graph 2($d$) illustrates the voltage across the inductor 16. Graph 2($e$) illustrates the delay voltage across the diodes 22$a$–22$c$.

It is seen in Graph 2($a$) that during the first half cycle of current flow, the oscillatory current $I_o$ varies at a sinusoidal rate that is determined by the circuit parameters, namely, the inductance of the inductor 16 and the capacitance of the capacitor 18. The current $I_o$ can be expressed by the following equation, $$I_o(t)=\frac{E_o}{\omega_1 L}\sin \omega_1 t$$

where $E_o$ is the voltage of the 10 volt source, L is the inductance of inductor 16, and $$\omega_1=\frac{1}{\sqrt{LC_1}}$$

where $C_1$ is the capacitance of the capacitor 18 and $\omega_1$ is the angular frequency in radians per second.

The maximum values of the voltages $E_c$ and $E_L$ are equal to the source voltage $E_o$, and the voltages $E_c$ and $E_L$ are at all times equal and opposite to each other. While the diodes 22$a$–22$c$ are conducting, they have a small impedance and hence a small voltage is developed thereacross as shown in Graph 2($e$).

It is noted in Graph 2($b$) that the current through the transistors 10 and 38 has two components, namely the direct current $I_{dc}$ and the oscillatory current $I_o$ superimposed thereon.

At the end of the first half cycle of oscillation, the capacitor 18 is fully charged with a polarity opposite to its original polarity, as shown in Graph 2($c$), and has a tendency to reverse the direction of the oscillatory current $I_o$. Since the diodes 22$a$–22$c$ will not conduct current in the reverse direction, they present a high reactive impedance, in the form of a low diode capacitance 60, shown in phantom in FIG. 1. The circuit parameters now are composed of the capacitor 18, the inductor 16, and the diode capacitance 60, which preferably has a very small magnitude as compared with the capacitor 18. Since the diode capacitance 60 is much smaller than that of the capacitor 18, the frequency of oscillation will now be controlled primarily by the diode capacitance. Accordingly, the frequency will increase to a value $\omega_2$ determined by the following expression, $$\omega_2=\frac{1}{\sqrt{L\left(\frac{C_1\times C_d}{C_1+C_d}\right)}}$$

where $C_d$ is the capacitance of the diodes 22$a$–22$c$.

Assuming that the diode capacitance 58 is $\frac{1}{15}$ that of the main capacitor 18 the higher frequency $\omega_2$ will be four times that of the original frequency $\omega_1$. The higher frequency current $I_o'$, shown in the right half portion of Graph 2($a$), is given by the follow-expression, $$I_o(t)=\frac{E_o}{\omega_2 L}\sin \omega_2(t-t_s)$$

where $t_s$ is the time at which the diodes 22$a$–22$c$ stop conducting. Under the higher frequency oscillating conditions, the capacitor 18 acts as a substantially constant voltage source of magnitude approximately $-E_o$, with a small ripple or variation due to its small internal reactance, superimposed on the constant voltage, as shown in Graph 2($c$). The capacitor voltage $E_o$ drives the inductor 16 and the diode capacitance 60 into oscillation, the voltage $E_d$ across the diodes 22$a$–22$c$ tries to become substantially equal and opposite to the sum of the voltage $E_L$ across the inductance 22 and the voltage $E_c$, as shown in phantom in FIG. 2. However, the maximum voltage across the diodes 22$a$–22$c$ is limited by the forward conduction of the base emitter junction of third transistor 42.

The voltage $E_d$ across the diodes 22$a$–22$c$ constitutes the delay voltage. It is seen from Graph 2($e$) that the delay voltage is delayed in time by at least one half period of the lower oscillation frequency $\omega_1$, the exact amount of the delay depending upon the time required for the voltage across diodes 22$a$–22$c$ to reach a certain useful threshold voltage $E_t$, shown as a dashed line in Graph 2($e$).

It is noted that the time delay of the delay pulse is determined primarily by the inductance and capacitance of the inductor 16 and capacitor 18, respectively. The time for the diode voltage $E_d$ to rise to the threshold value $E_t$ is determined by the ratio of the capacitances of the capacitor 18 and the diodes 22$a$–22$c$. For example, if the diode capacitance is made smaller, the higher oscillation frequency $\omega_2$ will be greater, thereby producing a steeper wavefront on the delay voltage pulse, and decreasing the time required to reach the threshold voltage $E_t$.

As discussed above, at the end of the first half cycle of oscillation, the diodes 22$a$–22$c$ turnoff, which allows the voltage across them to go positive to develop the delay pulse. A portion of the positive delay pulse is coupled to the base of transistor 42 turning the latter on and thereby charging capacitor 48 through the base emitter junction of transistor 50, thereby turning it on and producing a positive output pulse across the resistor 54. The output pulse is an amplified replica of the delay pulse produced across the diodes 22$a$–22$c$.

In accordance with the invention, another portion of the positive delay pulse produced across the diodes 22$a$–22$c$ is coupled through resistor 40 to the base of transistor 38, causing the latter to turn off. When transistor 38 turns off, transistor 10, which is regeneratively coupled thereto, turns off also. The resonant circuit stops oscillating. Capacitor 18 now quickly recharges through the charging circuit as originally described. The delay circuit is now ready for another trigger pulse 58.

It will be appreciated that the time within which another trigger pulse 58 can be applied, or the repetition rate, is determined in part by the time within which the transistors 10 and 38 are turned off after the generation of the delay pulse. Since a portion of the delay pulse itself is coupled back to turn off the transistors, it is seen that the present circuit operates to turn off the transistors almost immediately after the delay pulse is produced. In other words, the time at which the transistors 10 and 38 are regeneratively turned off is determined by the circuit parameters of the resonant circuit, namely the capacitance of capacitor 18 and the inductance of inductor 16. Thus, it is seen that when additional capacitor sections 26 and 32 and inductor sections 24 and 30 are selectively added to the circuit to increase the delay time, the regenerative turn off time of the transistor is automatically determined by the total circuit parameters, just as is the delay time. The repetition rate for short delay times is thus higher than for longer delay times. This presents a distinct advantage over certain prior art circuits wherein the repetition rate is determined by the longest delay time desired.

The delay circuit of the invention was explained successfully with the following circuit values:

| | |
|---|---|
| First transistor **10** | Type 2N706. |
| Resistor **12** | 100 ohms. |
| Resistor **14** | 1K. |
| Inductor **16** | 1 millihenry. |
| Capacitor **18** | 0.1 microfarad. |
| Diode **22***a* | Type 1N914. |
| Diode **22***b* | Type 1N914. |
| Diode **22***c* | Type 1N914. |
| Inductor **24** | 1 millihenry. |
| Capacitor **26** | .01 microfarad. |
| Inductor **30** | 1 millihenry. |
| Capacitor **32** | .01 microfarad. |
| Resistor **36** | 10K. |
| Second transistor **38** | Type 2N3250. |
| Resistor **40** | 1K. |
| Third transistor **42** | Type 2N706. |
| Resistor **44** | 10K. |
| Resistor **46** | 100K. |
| Capacitor **48** | 30 picofarads. |
| Fourth transistor **50** | Type 2N3250. |
| Resistor **52** | 10K. |
| Resistor **54** | 1K. |
| Resistor **60** | 51 ohms. |

The embodiments of the invention in which an exclusive property or privilege is claimed are defined as follows:

1. A time delay circuit comprising:
a normally open switching circuit;
a series resonant circuit including diode means and a capacitive device connected in series with said switching circuit;
means for establishing an initial charge on said capacitive device;
means for applying a trigger signal to said switching circuit to close the same and establish an oscillating condition in said resonant circuit and to derive an output signal from said diode means;
and means for coupling to said switching circuit a portion of the output signal from said diode means so as to open said switching circuit at the end of the first half cycle of oscillation.

2. The invention according to claim 1, wherein said switching circuit comprises two transistor circuits coupled regeneratively.

3. A time delay circuit comprising:
transistor circuit means;
means for supplying operating potentials to said transistor circuit means to initially establish an open circuit therein;
a series resonant circuit in series with said transistor circuit means and including a capacitor, an inductor, and a diode means;
means for charging said capacitor to an initial potential;
means for applying a trigger signal to said transistor circuit means to cause conduction therethrough and establish an oscillating condition in said resonant circuit;
means for taking an output signal from said diode means;
and means for coupling to said transistor circuit means a portion of the output signal from said diode means so as to open said transistor circuit means within a time set by the reactive components of said resonant circuit.

4. The invention according to claim 3, wherein said means for taking an output signal from said diode means includes a transistor amplifier.

5. A normally open switch means;
series resonant means in circuit therewith;
trigger means for initially closing said switch means thereby initiating oscillation in said resonant means;
regenerative feedback means connected in series circuit between said resonant means and said switch means for maintaining said switch means closed for a period at least equal to the first half cycle of said oscillation; and
means for deriving a delayed output from a portion of the first half cycle of oscillation.

No references cited.

ARTHUR GAUSS, *Primary Examiner.*